US008836531B2

(12) United States Patent
Lin

(10) Patent No.: US 8,836,531 B2
(45) Date of Patent: Sep. 16, 2014

(54) ACTIVE WARNING DEVICE FOR SERVER AND WARNING METHOD THEREOF

(75) Inventor: Po-Han Lin, Taipei Hsien (TW)

(73) Assignee: Wistron Corporation, Taipei Hsien (TW)

( * ) Notice: Subject to any disclaimer, the term of this patent is extended or adjusted under 35 U.S.C. 154(b) by 11 days.

(21) Appl. No.: 13/613,018

(22) Filed: Sep. 13, 2012

(65) Prior Publication Data

US 2014/0015686 A1    Jan. 16, 2014

(30) Foreign Application Priority Data

Jul. 10, 2012  (TW) .............................. 101124845 A

(51) Int. Cl.
| | |
|---|---|
| G08B 21/00 | (2006.01) |
| G08B 1/08 | (2006.01) |
| G08B 13/00 | (2006.01) |
| G08B 23/00 | (2006.01) |
| G08B 5/36 | (2006.01) |
| H05K 7/14 | (2006.01) |
| H05K 7/16 | (2006.01) |

(52) U.S. Cl.
USPC ..................... 340/686.6; 340/571; 340/539.1; 340/541; 340/321; 340/565; 340/815.73; 361/796; 361/727

(58) Field of Classification Search
USPC .............. 340/502, 505, 506, 526, 531, 539.1, 340/628, 630, 309.6, 539.18; 455/73, 701; 348/142, 143, 152, 159
See application file for complete search history.

(56) References Cited

U.S. PATENT DOCUMENTS

| | | | | |
|---|---|---|---|---|
| 5,139,895 | A | * | 8/1992 | Roy et al. ....................... 429/415 |
| 5,963,126 | A | * | 10/1999 | Karlin et al. ................... 340/321 |
| 6,133,830 | A | * | 10/2000 | D'Angelo et al. ............. 340/571 |
| 8,284,054 | B2 | * | 10/2012 | Zang et al. ..................... 340/541 |
| 2003/0031003 | A1 | * | 2/2003 | Sucharczuk et al. ........... 361/796 |
| 2004/0165358 | A1 | * | 8/2004 | Regimbal et al. .............. 361/727 |
| 2008/0007405 | A1 | * | 1/2008 | Kuo ............................... 340/565 |
| 2008/0106430 | A1 | * | 5/2008 | Yeh ........................... 340/815.73 |
| 2009/0009997 | A1 | * | 1/2009 | Sanfilippo et al. ............. 362/244 |
| 2010/0039253 | A1 | * | 2/2010 | Zang et al. ................. 340/539.1 |
| 2013/0113625 | A1 | * | 5/2013 | Libby ............................ 340/541 |

FOREIGN PATENT DOCUMENTS

WO     WO 2012080546 A1 *  6/2012

\* cited by examiner

*Primary Examiner* — Jennifer Mehmood
*Assistant Examiner* — Mirza Alam
(74) *Attorney, Agent, or Firm* — Rosenberg, Klein & Lee

(57) ABSTRACT

The present disclosure provides an active warning device for server and the warning method thereof. The active warning device is applied to a server. When a control module in the server is departing from a midplane board, the active warning device can provide warning actively. Thereby, a user can notice that the control module is been drawing out of the server and then uses his both hands to support it for preventing tilt, fall, and hence damage of the control module.

9 Claims, 10 Drawing Sheets

ACTIVE WARNING DEVICE FOR SERVER AND WARNING METHOD THEREOF

FIELD OF THE DISCLOSURE

The present disclosure relates generally to an active warning device and the warning method thereof, and particularly to an active warning device for server and the warning method thereof.

BACKGROUND OF THE DISCLOSURE

Traditional computer servers adopt the upright tower design, while most current computer servers adopt the rack design and the blade design. The components in a rack server are standardized and used with a chassis. Thereby, the space occupied by the server is reduced substantially and thus enabling better coordination and manageability. Likewise, a blade server adopts concentrated single boards for making use of the internal space of the server effectively. Hence, hardware replacement, upgrade, and maintenance for the server can be performed with ease.

No matter rack or blade server, a midplane board and at least a control module are disposed in a chassis of the server. The control module is inserted to the midplane board. When the hardware of the control module has a breakdown and repair or expansion is required, a user has to draw the control module out of the chassis first. Due to the longer length and heavier weight of the control module, when the user draws the control module out of the chassis, if he is distracted or does not use both hand to support the control module before taking out, he may drop and damage the control module.

Accordingly, the present disclosure provides an active warning device for server. According to the present disclosure, the active warning device can remind the user that the control module has not drawn out of the chassis completely, thereby extra attention has to be paid, and both hands should be used for supporting. Hence, insecurity in taking the control module and falling of the control module can be prevented.

SUMMARY

An objective of the present disclosure is to provide an active warning device for server. When a control module in a server is departing from a midplane board, the active warning device can provide warning actively. Thereby, a user can notice that the control module is been drawing out of the server and then uses his both hands to support it for preventing tilt, fall, and hence damage of the control module.

The present disclosure provides an active warning device, which is applied to a server. The server comprises a midplane board and at least a control module connected to the midplane board. The active warning device comprises at least a reflector, at least a sensor, and an alarm. The reflector is disposed in the corresponding control module. The sensor is disposed on the midplane board corresponding to the reflector and connected electrically to a multiplexer of the midplane board. The alarm is disposed on the midplane board and connected electrically to the multiplexer. When the control module departs from the midplane board, the sensor transmits energy to the reflector, which reflects the energy. Then the sensor receives the reflected energy and produces a sensing signal. The sensor transmits the sensing signal to the multiplexer, which produces a warning signal according to the sensing signal and transmits the warning signal to the alarm. The alarm then produces a warning sound according to the warning signal.

The present disclosure provides a warning method of an active warning device for server. The method comprises steps of judging if a control module departs from a midplane board; activating a sensor and an alarm, and the alarm producing a warning sound; the sensor judging and producing a sensing signal; calculating the distance between the control module and the midplane board; comparing the distance between the control module and the midplane board with the length of the control module, and judging if the distance between the control module and the midplane board is smaller or equal to the length of the control module; and producing a warning signal according to the distance between the control module and the midplane board, and the alarm producing a warning sound according to the warning signal.

The present disclosure provides another active warning device, which is applied to a server. The server comprises a midplane board and at least a control module connected to the midplane board. The active warning device comprises at least a sensor and at least an alarm. The sensor is disposed in the corresponding control module and connected electrically to a controller of the control module. The alarm is disposed in the corresponding control module and connected electrically to the controller of the control module. When the control module departs from the midplane board, the sensor produces a sensing signal and transmits the sensing signal to the controller. Then the controller produces a warning signal according to the sensing signal. The controller transmits the warning signal to the alarm, which produces a warning sound according to the warning signal.

DETAILED DESCRIPTION

In order to make the structure and characteristics as well as the effectiveness of the present disclosure to be further understood and recognized, the detailed description of the present disclosure is provided as follows along with embodiments and accompanying figures.

The server according to prior art has a midplane board and at least a control module in a chassis with the control module inserted to the midplane board. When the hardware of the control module has a breakdown and repair or expansion is required, a user has to draw the control module out of the chassis first. Due to the longer length and heavier weight of the control module, when the user draws the control module out of the chassis, if he is distracted or does not use both hand to support the control module before taking out, he may drop and damage the control module. For solving the problem described above, the present disclosure provides an active warning device for server.

Figure 1A:
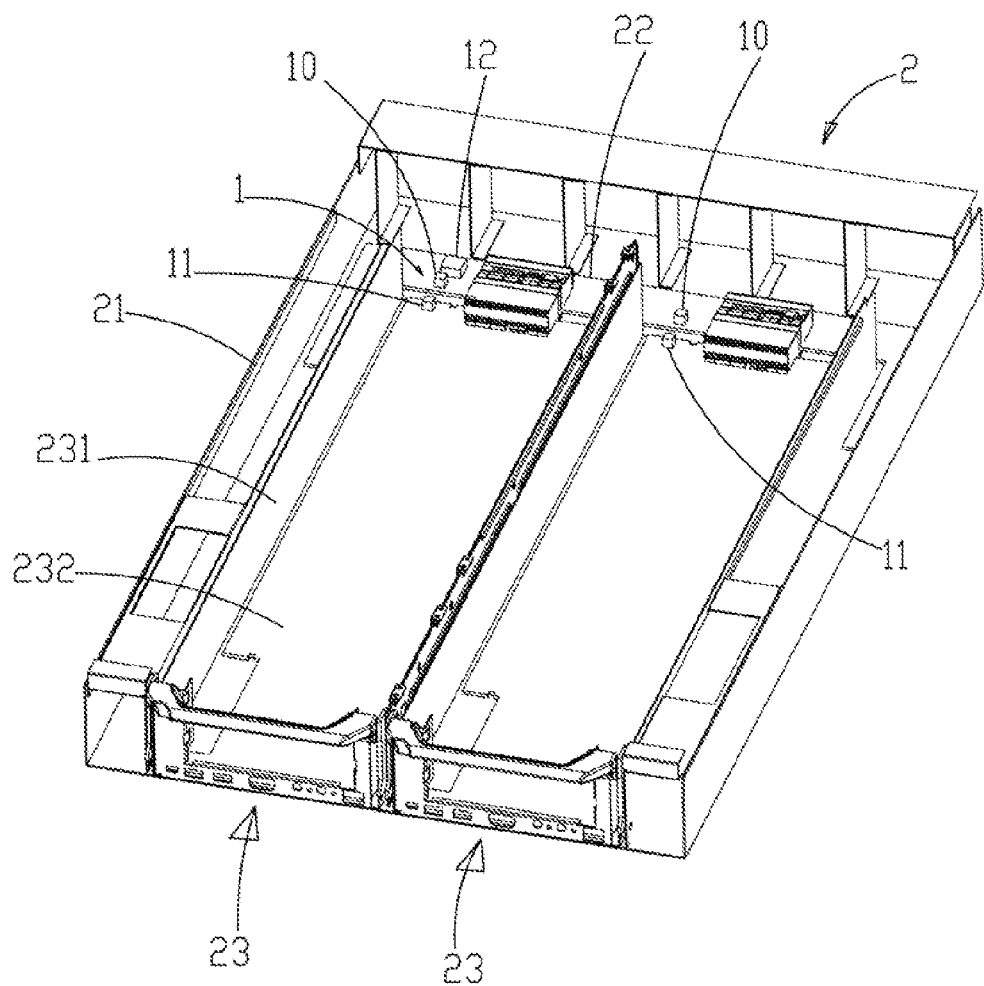
FIG. 1A shows a schematic diagram of the active warning device according the first embodiment of the present disclosure.
Figure 1B:
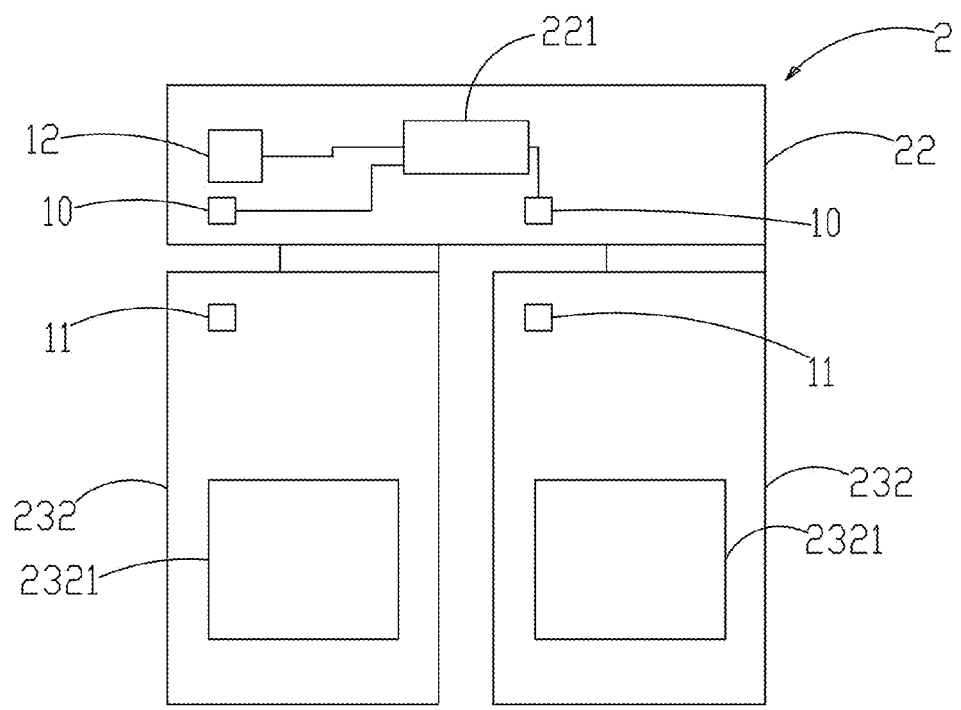
FIG. 1B shows a block diagram of the active warning device according the embodiment of the present disclosure.

FIGS. 1A and 1B show a schematic diagram and a block diagram of the active warning device according a first embodiment of the present disclosure. As shown in the figures, the present disclosure provides an active warning device 1, which is applied to a server 2. The server 2 comprises a chassis 21, a midplane board 22, and at least a control module 23. The midplane board 22 is disposed in the chassis 21. The control module 23 is inserted to the midplane board 22. A plurality of electronic devices of the midplane board 22 is controlled by a multiplexer 221. The control module 23 comprises a housing 231 and a computer operating unit 232. The computer operating unit 232 is disposed in the housing 231. A plurality of electronic devices of the computer operating unit 232 is controlled by a baseboard management controller (BMC) 2321. The active warning device 1 according to the present embodiment comprises at least a sensor 10, at least reflector 11, and an alarm 12. The sensor 10 and the alarm 12 according to the present embodiment are disposed on the midplane board 22. The reflector 11 is disposed in the control module 23 and corresponding to the sensor 10. The sensor 10 and the alarm 12 are connected electrically to the multiplexer 221 of the midplane board 22, which supplies power to the sensor 10 and the alarm 12 for maintaining their normal operations. The sensor 10 according to the present embodiment is an infrared distance sensor. In addition, a laser distance sensor or an ultrasonic distance sensor can be used, too. The alarm 12 is a buzzer.

Figure 2:
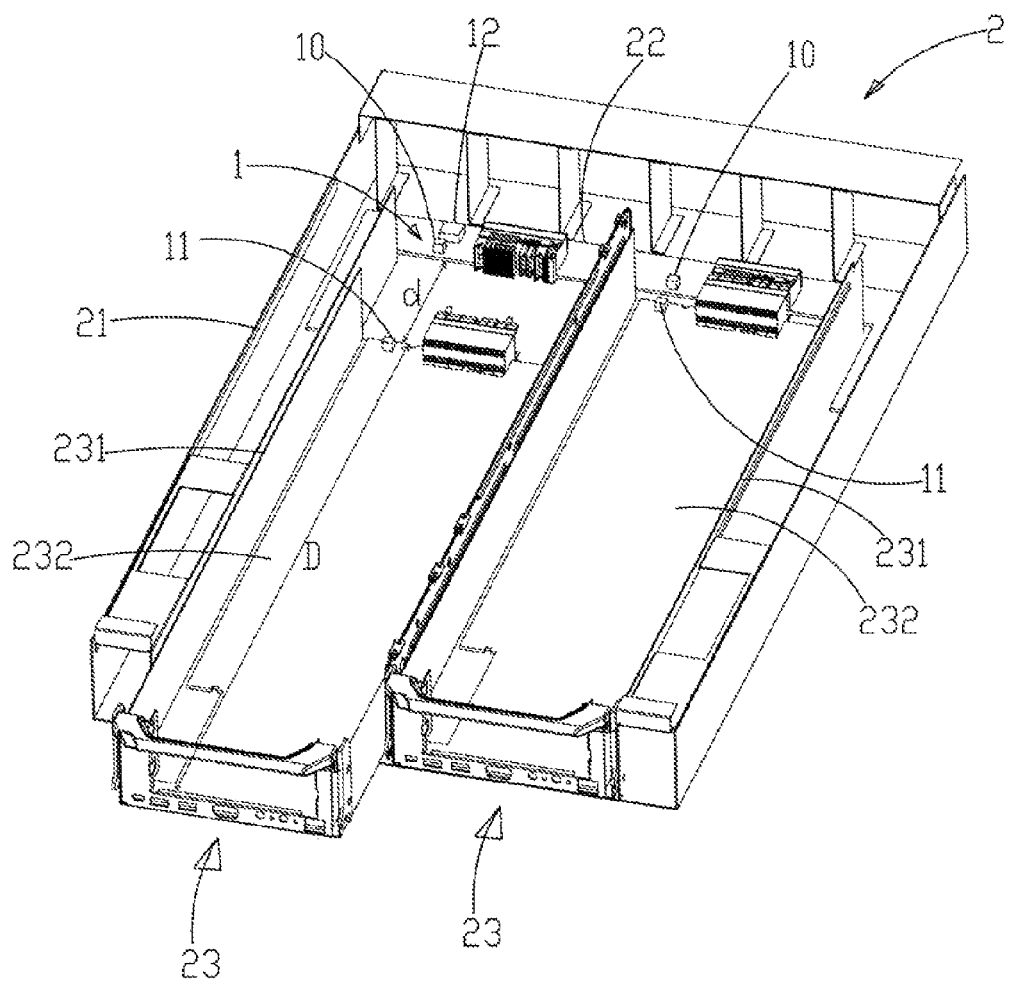
FIG. 2 shows a usage status diagram of the active warning device according the first embodiment of the present disclosure.
Figure 3:
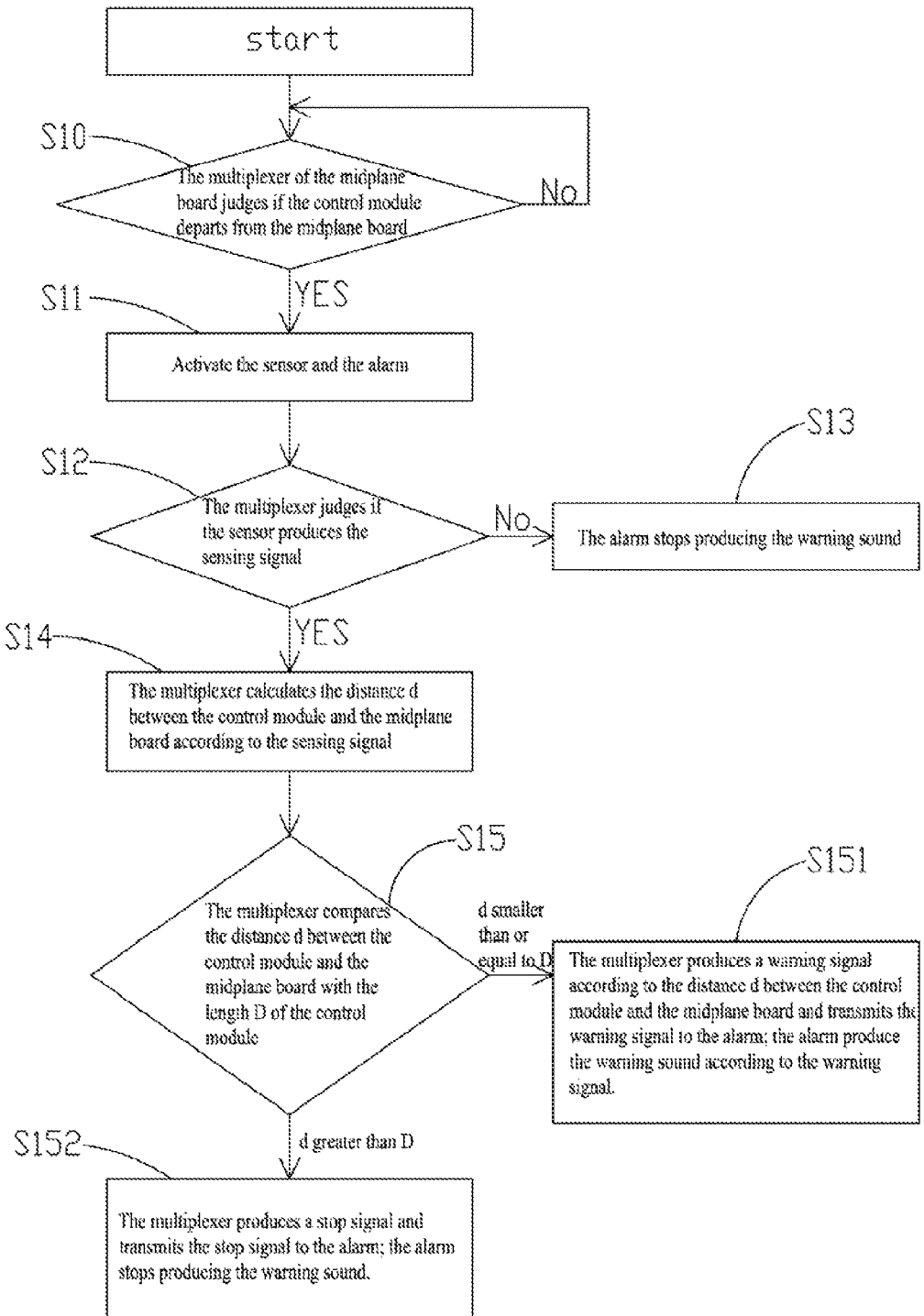
FIG. 3 shows a flowchart of the active warning device according the first embodiment of the present disclosure.

FIG. 2 and FIG. 3 show a usage status diagram and a flowchart of the active warning device according the first embodiment of the present disclosure. As shown in the figures, after the active warning device 1 is disposed in the server 2, during operation, the step S10 is first executed. The multiplexer 221 of the midplane board 22 judges if the control module 23 departs from the midplane board 22. If the multiplexer 221 judges that the control module 23 has not departed from the midplane board 22, the sensor 10 and the alarm 12 will not be activated. Then the step S10 is repeated. If the multiplexer 221 judges that the control module 23 departs from the midplane board 22, the step S11 is executed for activating the sensor 10 and the alarm 12. The sensor 10 transmits energy, which can infrared light, laser, or ultrasonic wave, to the reflector 11. The alarm 12 produces a warning sound.

Next, the step S12 is executed. The multiplexer 221 judges if the sensor 10 produces the sensing signal. When the reflector 11 reflects the energy transmitted by the sensor 10, the sensor 10 receives the reflected energy. Namely, the sensor 10 produces a sensing signal according to the reflected energy. The sensor 10 transmits the sensing signal to the multiplexer 221. If the multiplexer 221 judges that the sensor 10 does not produce the sensing signal, it means that the sensor 10 does not receive the reflected energy. Then the step S14 is executed, in which step the multiplexer 221 calculates the distance d between the control module 23 and the midplane board 22 according to the sensing signal. Afterwards, the step S15 is executed, in which step the multiplexer 221 compares the distance d between the control module 23 and the midplane board 22 with the length D of the control module 23.

As the distance d between the control module 23 and the midplane board 22 is smaller than the length D of the control module 23, the step S151 is executed, in which step the multiplexer 221 produces a warning signal according to the distance d between the control module 23 and the midplane board 22, and transmits the warning signal to the alarm 12. The alarm 12 produces the warning sound according to the warning signal. Each warning signal can represent the distance d between the control module 23 and the midplane board 22. The alarm 12 produces the corresponding warning sound for warning according to each warning signal. In other word, if the distance d between the control module 23 and the midplane board 22 differs, the warning sound produced by the alarm 12 differs. For example, when the control module 23 just departs from the midplane board 22, the sensor 10 produces a first sensing signal and transmits the sensing signal to the multiplexer 221. The multiplexer 221 produces a first warning signal according to the first sensing signal and transmits the first warning signal to the alarm 12. The alarm 12 produces a warning sound according to the first warning signal. At this time, the frequency of the warning sound is moderate.

When the control module 23 is about to depart from the chassis 21, the sensor 10 produces a second sensing signal and transmits the second sensing signal to the multiplexer 221. The multiplexes 221 produces a second warning signal according to the second sensing signal and transmits the second warning signal to the alarm 12. The alarm 12 produces a warning sound according to the second warning signal. At this moment, the distance d between the control module 23 and the midplane board 22 is greater than the distance d when the control module 23 just departed from the midplane board 22. Thereby, the frequency of the warning sound is higher than the frequency when the control module just departed from the midplane board 22 for reminding the user of paying attention on removing the control module 23 from the chassis 21. The user should use both hands to support the control module 23 for preventing tilt and drop of the control module 23.

When the multiplexer 221 judges that the distance d between the control module 23 and the midplane board 22 is equal to the length D of the control module 23, the step S151 is executed, in which step the multiplexer 221 produces the warning signal and transmits the warning signal to the alarm 12. The alarm 12 produces the warning sound continuously according to the warning signal. Finally, when the multiplexer 221 judges that the distance d between the control module 23 and the midplane board 22 is greater than the length D of the control module 23, the step S152 is executed, in which step the multiplexer 221 produces a stop signal and transmits the stop signal to the alarm 12. Then the alarm 12 stops producing the warning sound.

Figure 4A:
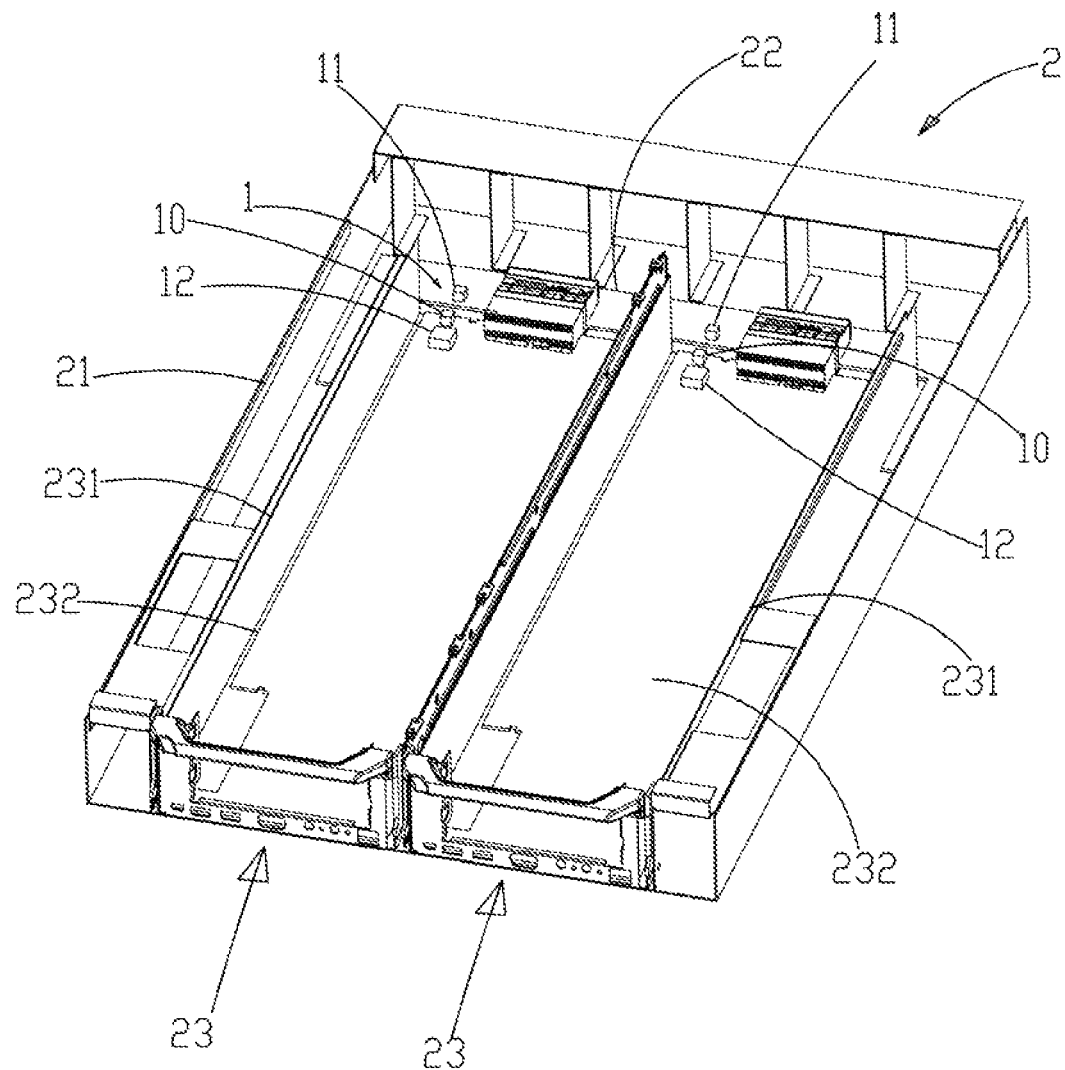
FIG. 4A shows a schematic diagram of the active warning device according the second embodiment of the present disclosure.
Figure 4B:
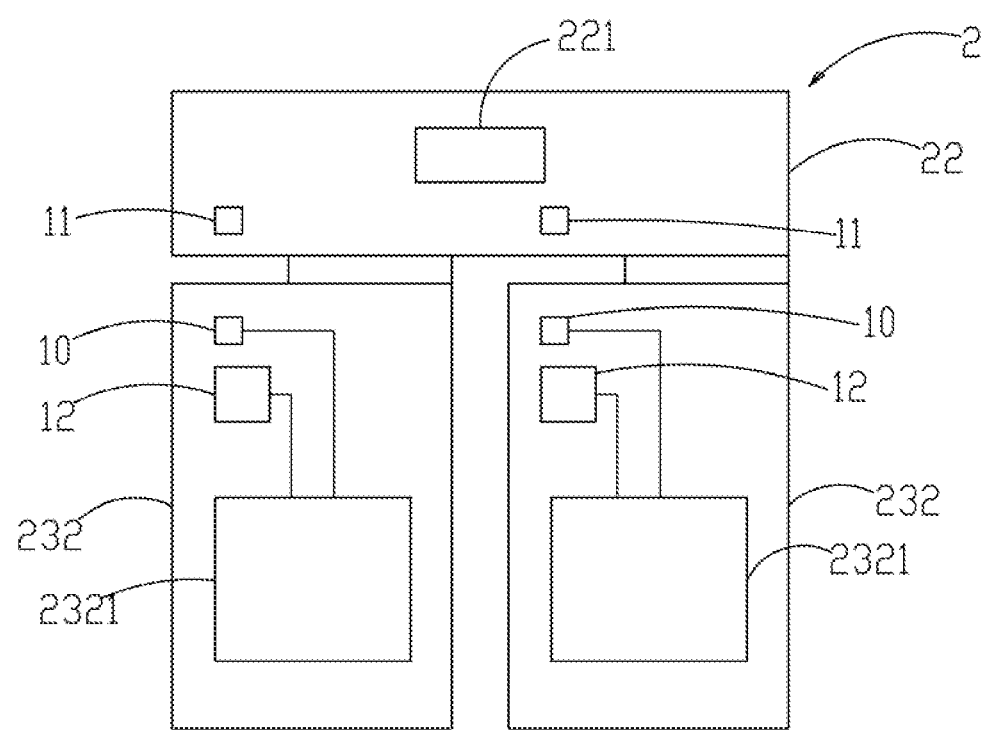
FIG. 4B shows a block diagram of the active warning device according the second embodiment of the present disclosure.

FIGS. 4A and 4B show a schematic diagram and a block diagram of the active warning device according a second embodiment of the present disclosure. As shown in the figures, the disposal locations of the sensor 10, the alarm 12, and the reflector 11 according to the present embodiment are opposite to those according to the first embodiment. The sensor 10 and the alarm 12 according to the present embodiment are disposed in the control module 23 and connected electrically to the controller 231 of the control module 23. The reflector 11 according to the present embodiment is disposed on the midplane board 22 and corresponding to the sensor 10 disposed in the control module 23. The power of the sensor 10 and the alarm 12 according to the present embodiment is supplied by the controller 231 for maintaining their operations.

The operations of the sensor 10 and the reflector 11 according to the present disclosure are the same as those according to the first embodiment. The details will not be repeated here. The sensor 10 produces a sensing signal and transmits the sensing signal to the controller 231. The controller 231 produces a warning signal according to the sensing signal and transmits the warning signal to the alarm 12. The alarm 12 produces a warning sound according to the warning signal for reminding the user of paying attention on removing the control module 23 from the chassis 21. The user should use both hands to support the control module 23 for preventing tilt and drop of the control module 23.

Figure 5A:
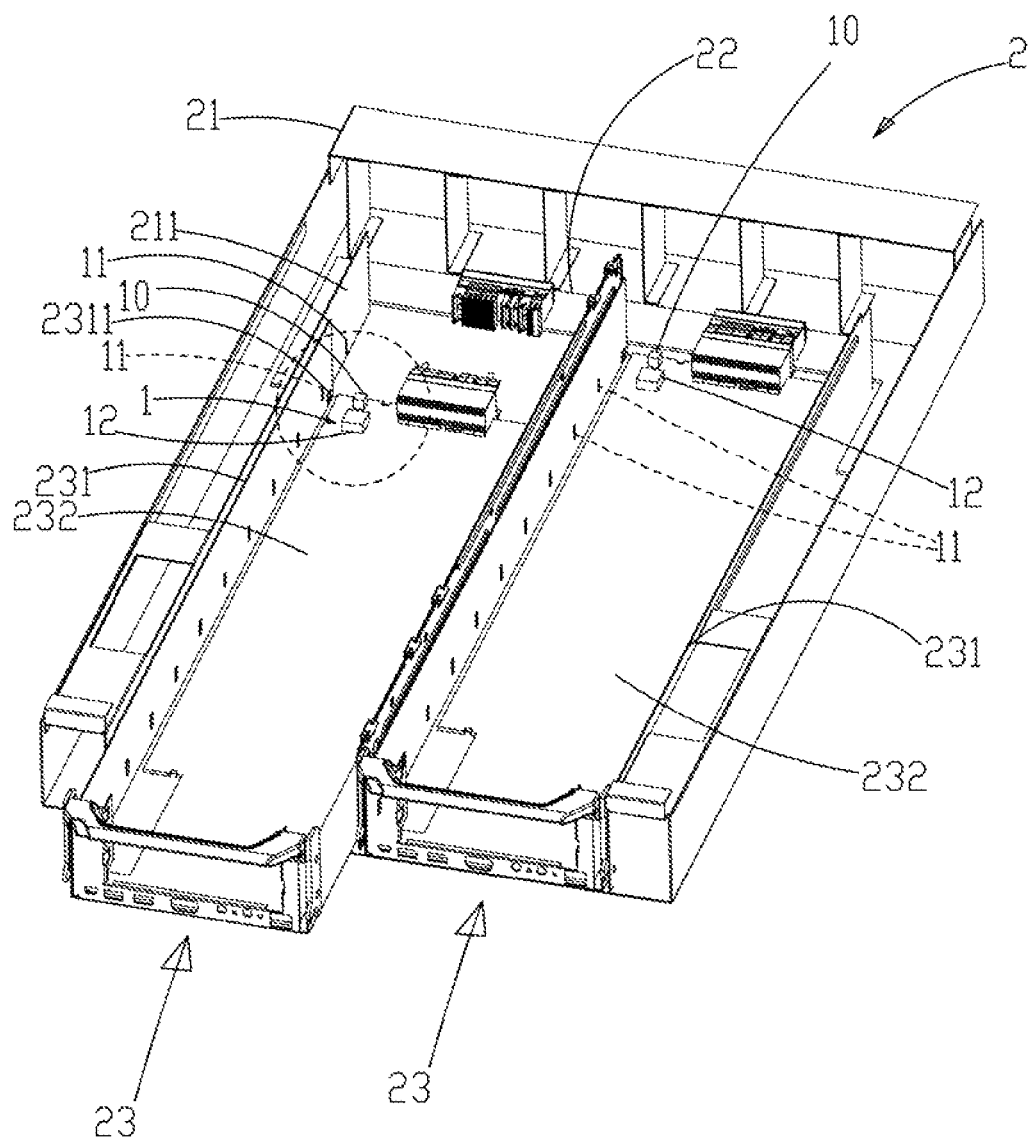
FIG. 5A shows a schematic diagram of the active warning device according the third embodiment of the present disclosure.
Figure 5B:
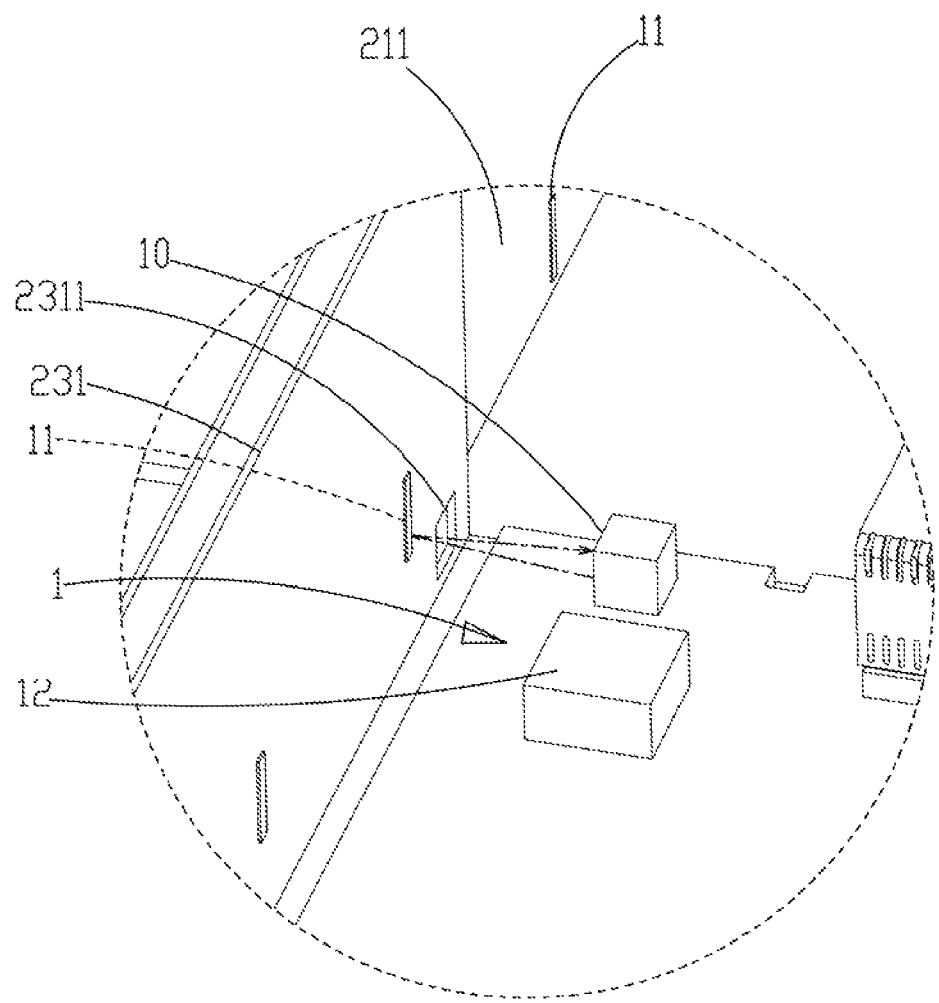
FIG. 5B shows a partially enlarged diagram of FIG. 5A.

FIGS. 5A and 5B show a schematic diagram and a partially enlarged diagram of the active warning device according the third embodiment of the present disclosure. As shown in the figures, the diffidence between the present embodiment and the second embodiment is that the reflector 11 according to the present embodiment is disposed on the sidewall 211 of the chassis 21 and located between the housing 231 of the control module and the chassis 21. The housing 231 has a hole 2311 corresponding to the sensor 10. When the control module 23 moves, because the hole 2311 corresponds to the reflector 11, the reflector 11 will correspond to the sensor 10, as shown in FIG. 5B. According to the present embodiment, a plurality of reflectors 11 can be disposed with even intervals. In addition, the shapes of the plurality of reflectors 11 are different. Alternatively, the heights at which the plurality of reflectors 11 are disposed are different. The details will not be described any further. Consequently, a plurality of sensing signals produced by the sensor 10 corresponding to the plurality of reflectors 11 differ. Thereby, the distance between the control module 23 and the midplane board 22 can be judged according to the plurality of sensing signals. A plurality of warning signals can be produced according to the plurality of sensing signals. Besides, various warning sounds can be produced according to the plurality of warning signals for achieving the warning purpose.

Figure 6:
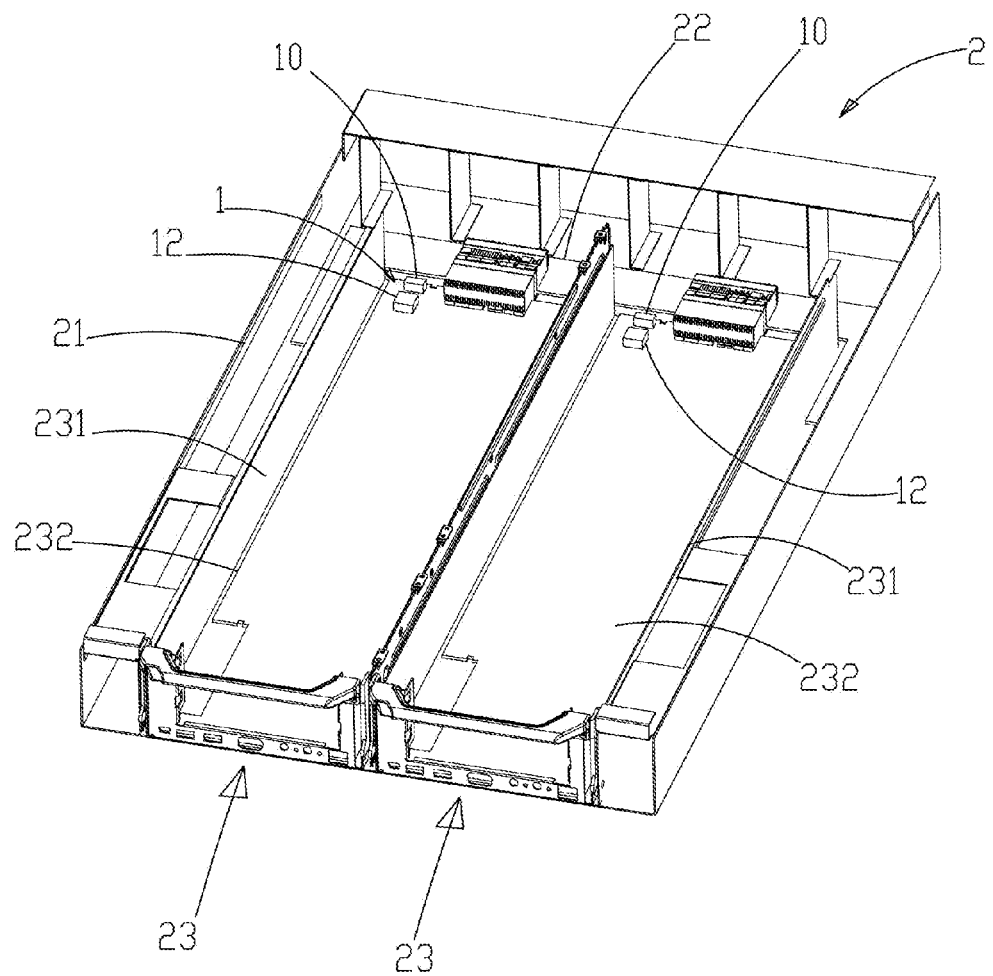
FIG. 6 shows a schematic diagram of the active warning device according the fourth embodiment of the present disclosure.

FIG. 6 shows a schematic diagram of the active warning device according a fourth embodiment of the present disclosure. As shown in the figure, the difference between the present embodiment and the previous one is that the present embodiment does not include the reflector. According to the present embodiment, only the sensor 10 and the alarm 12 are disposed in the control module 23, where the sensor 10 and the alarm 12 are connected electrically to the controller 231. The sensor 10 according to the present embodiment is close to the midplane board 22. Namely, the sensor 10 is located at the backend of the control module 23. (The end of the control module 23 located at opening of the chassis 21 is the front end.) When the backend of the control module 23 is about to depart from the chassis 21, the sensor 12 is activated, which enables the alarm 12 to produce the warning sound for warning the user to notice that the control module 23 is about to depart from the chassis 21. The sensor 10 according to the present embodiment is a micro switch. When the sensor 10 is activated, it will produce a sensing signal and transmits the sensing signal the controller 231 of the control module 23. The controller produces a warning signal according to the sensing signal and transmits the warning signal to the alarm 12. Then the alarm 12 will produce a warning sound according to the warning signal.

Figure 7:
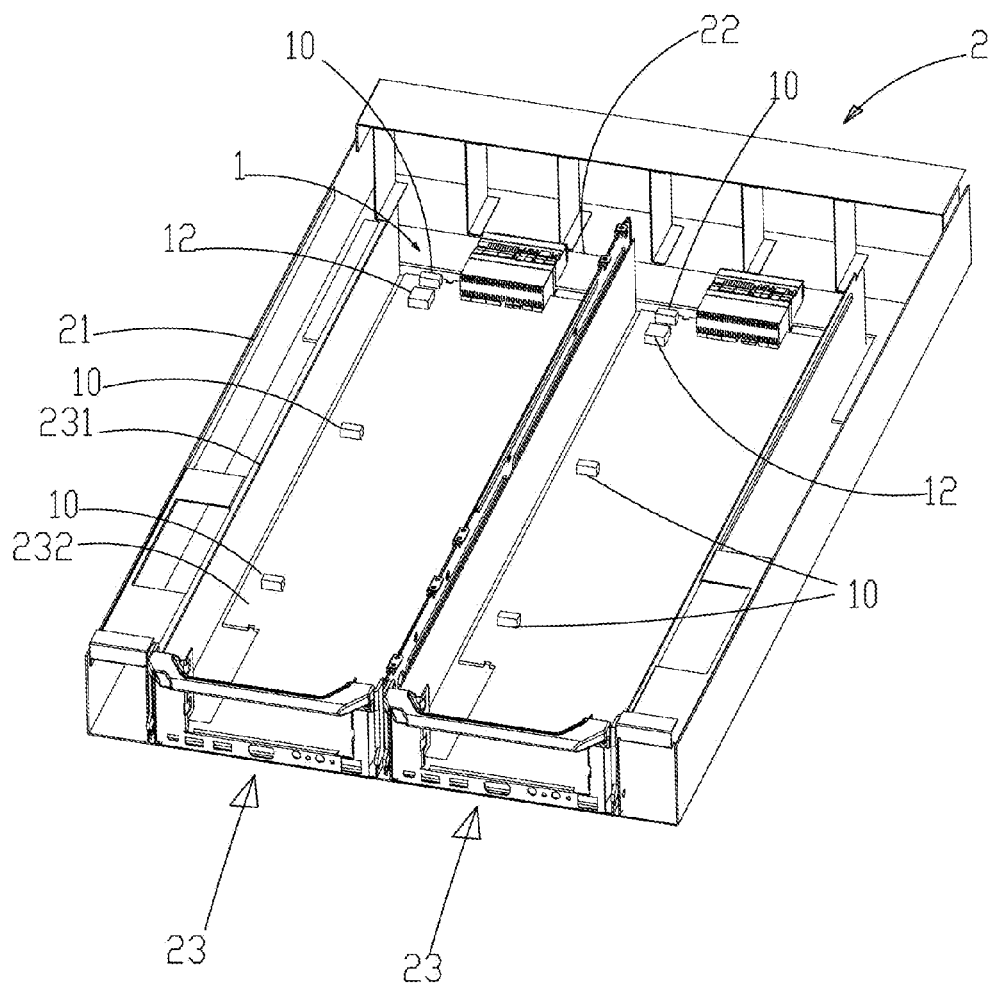
FIG. 7 shows a schematic diagram of the active warning device according the fifth embodiment of the present disclosure.

FIG. 7 shows a schematic diagram of the active warning device according a fifth embodiment of the present disclosure. As shown in the figure, the difference between the present embodiment and the previous one is that according to the present embodiment, a plurality of sensors 10 can be disposed with even intervals in the control module 23. Each sensor 10 will produce a sensing signal while being activated. Each sensing signal represents the current distance between the control module 23 and the midplane board 22. The controller 231 produces a corresponding warning signal according to the plurality of sensing signals, respectively. The alarm 12 produces a corresponding warning sound according to the plurality of warning signals, respectively. When the sensing signal represents that the control module is very close to the midplane board currently, the frequency of the warning sound corresponding to the sensing signal is moderate. As the sensing signal represents that the control module 23 departs from the midplane board 22 presently and gets closer to the opening of the chassis 21, the frequency of the warning sound corresponding to the sensing signal is getting rapid for reminding the user that the control module 23 is being removed from the chassis 21; he should notice if the control module 23 is supported well.

To sum up, the present disclosure relates to an active warning device applied mainly to a server. When a control module is departing from a midplane board, the active warning device can provide warning actively. Thereby, a user can notice that the control module is been drawing out of the server and then uses his both hands to support it for preventing tilt, fall, and hence damage of the control module.

Accordingly, the present disclosure conforms to the legal requirements owing to its novelty, nonobviousness, and utility. However, the foregoing description is only embodiments of the present disclosure, used to limit the scope and range of the present disclosure. Those equivalent changes or modifications made according to the shape, structure, feature, or spirit described in the claims of the present disclosure are included in the appended claims of the present disclosure.

The invention claimed is:

1. An active warning device, applied to a server including a midplane board and at least a control module connected to said midplane board, comprising:
    at least a reflector, disposed in said corresponding control module;
    at least a sensor, disposed on said midplane board, corresponding to said reflector, and connected electrically to a multiplexer of said midplane board; and
    an alarm, disposed on said midplane board, and connected electrically to said multiplexer of said midplane board;
    where when said control module departs from said midplane board, said sensor transmits energy to said reflector;
    said reflector reflects said energy;
    said sensor receives said reflected energy and produces a sensing signal; said sensor transmits said sensing signal to said multiplexer;
    said multiplexer calculates a distance between said control module and said midplane board according to said sensing signal, and compares said distance with a length of said control module;
    said multiplexer produces a warning signal according to said distance while said distance is smaller than said length of said control module, and said multiplexer transmits said warning signal to said alarm; and said alarm produces a warning sound according to said warning signal;
    wherein said step of comparing the distance between said control module and said midplane board with the length of said control module further comprises a step of judging the distance between said control module and said midplane board is greater than the length of said control module, a stop signal is produced and said alarm stops producing said warning sound according to said stop signal.

2. The active warning device of claim 1, wherein said energy of said sensor be infrared light, laser light, or ultrasonic waves.

3. The active warning device of claim 1, wherein said alarm is a buzzer.

4. A warning method of an active warning device for server, comprising steps of:
   judging if a control module departs from a midplane board;
   activating a sensor and an alarm, and said alarm producing a warning sound; judging said sensor for producing a sensing signal;
   calculating the distance between said control module and said midplane board;
   comparing the distance between said control module and said midplane board with the length of said control module, and judging if the distance between said control module and said midplane board smaller than or equal to the length of said control module; and
   producing a warning signal according to the distance between said control module and said midplane board, and said alarm producing a warning sound according to said warning signal;
   wherein said step of comparing the distance between said control module and said midplane board with the length of said control module further comprises a step of judging the distance between said control module and said midplane board is greater than the length of said control module, a stop signal is produced and said alarm stops producing said warning sound according to said stop signal.

5. The warning method of said active warning device for server of claim 4, wherein the frequency of said warning sound varies according to the distance between said control module and said midplane board.

6. An active warning device, applied to a server including a midplane board and at least a control module connected to said midplane board, comprising:
   at least a sensor, disposed in said corresponding control module, and connected electrically to a controller of said control module;
   at least an alarm, disposed in said corresponding control module, and connected electrically to said controller of said control module; and
   a chassis accommodating said midplane board and said control module;
   where while a backend of said control module is about to depart from said midplane board, said sensor is activated to enable said alarm for producing a warning sound to warn that said control module is about to depart from said midplane board;
   when said control module departs from said midplane board, said sensor produces a sensing signal and transmits said sensing signal to said controller;
   said controller produces a warning signal according to said sensing signal and transmits said warning signal to said alarm;
   said alarm produces a warning sound according to said warning signal; and
   at least a reflector disposed on the sidewall of said chassis and located on the side of said control module adjacent to said chassis, said sensor transmitting energy to said reflector, said reflector reflecting said energy, said sensor receiving said reflected energy and producing said sensing signal, said sensor transmitting said sensing signal to said controller; and said controller producing said warning signal according to said sensing signal.

7. The active warning device of claim 6, wherein said sensor is a micro switch.

8. The active warning device of claim 6, wherein said energy of said sensor can be infrared light, laser light, or ultrasonic waves.

9. The active warning device of claim 6, wherein said alarm is a buzzer.

* * * * *